(12) United States Patent
Takatani et al.

(10) Patent No.: US 6,396,092 B1
(45) Date of Patent: May 28, 2002

(54) SEMICONDUCTOR DEVICE AND METHOD FOR MANUFACTURING THE SAME

(75) Inventors: Shinichiro Takatani, Koganei; Hiroshi Miki, Shinjuku-ku; Keiko Kushida, Kodaira; Yoshihisa Fujisaki; Kazuyoshi Torii, both of Hachioji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/381,396

(22) PCT Filed: Mar. 24, 1998

(86) PCT No.: PCT/JP98/01271

§ 371 (c)(1),
(2), (4) Date: Sep. 20, 1999

(87) PCT Pub. No.: WO98/44551

PCT Pub. Date: Oct. 8, 1998

(30) Foreign Application Priority Data

Mar. 27, 1997 (JP) ............................................. 9-074993
Mar. 27, 1997 (JP) ............................................. 9-074994

(51) Int. Cl.$^7$ ........................ H01L 29/06; H01L 27/108
(52) U.S. Cl. ................... 257/295; 257/303; 257/306; 257/309; 257/310; 257/741; 438/3; 438/244; 438/253; 438/387; 438/396; 438/239; 438/240; 365/65; 365/87; 365/1.7; 365/145
(58) Field of Search ............................... 257/295, 741, 257/310, 303, 306, 309; 315/65, 87, 117, 145; 438/3, 244, 253, 387, 396, 239, 240

(56) References Cited

U.S. PATENT DOCUMENTS 5,005,102 A    4/1991  Larson
5,751,540 A  * 5/1998  Lee et al. ................. 361/321.4
5,986,301 A  * 11/1999 Fukushima et al. ......... 257/306
6,078,072 A  * 6/2000  Okudaira et al. ........... 257/295
6,151,240 A  * 11/2000 Suzuki ....................... 365/145

FOREIGN PATENT DOCUMENTS

JP   63201998        8/1988
JP   4-206871    *   7/1992

OTHER PUBLICATIONS

H.P. Bonzel et al, Adsorbate interactions on a Pt(110) surface. I. Sulfur and carbon monoxide., May. 15, 1973, pp. 4617–4624.*

Maniar et al., "Impact of Backend Processing on Integrated Ferroelectric Capacitor Characteristics", Mat. Res. Soc. Symp. Proc. vol. 310, 1993, pp. 151–156.

Hase et al., "Analysis of the Degradation of PZT and $SrBi_2Ta_2O_9$ Thin Films with a Reductive Process", $8^{th}$ Int'l Symposium on Integrted Ferroelectrics 11C (1996).

* cited by examiner

Primary Examiner—Steven Loke
Assistant Examiner—Dongee Kange
(74) Attorney, Agent, or Firm—Antonelli, Terry, Stout & Kraus, LLP

(57) ABSTRACT

A semiconductor device includes a capacitor having a lower electrode (102), a high-dielectric-constant or ferroelectric thin film (103), and an upper electrode (104) which are subsequently stacked. An impurity having an action of suppressing the catalytic activity of a metal or a conductive oxide constituting the electrode is added to the upper electrode (104). The addition of the impurity is effective to prevent inconveniences such as a reduction in capacitance, an insulation failure, and the peeling of the electrode due to hydrogen heat-treatment performed after formation of the upper electrode (104), and to improve the long-term reliability.

10 Claims, 13 Drawing Sheets

104: PLATINUM LAYER WITH Pb ADDITIVE (TOP ELECTRODE)

103: FERROELECTRIC THIN FILM

102: BOTTOM ELECTRODE

101: DEVICE LAYER INCLUDING TRANSISTORS (OR METAL SUPPORT)

SEMICONDUCTOR DEVICE AND METHOD FOR MANUFACTURING THE SAME

TECHNICAL FIELD

The present invention relates to a semiconductor device and a fabrication method thereof, and particularly to a semiconductor device which has a capacitor using a high-dielectric-constant or ferroelectric material thin film as a capacitor dielectric film and exhibiting a reduced leakage current, a large capacitance and a high residual polarization, and which is suitable for a memory of a large-scale integrated circuit (LSI), and a fabrication method thereof.

BACKGROUND ART

A semiconductor memory, typically a dynamic random access memory (DRAM) has a problem associated with the increased area and complicated structure of a capacitor along with a higher level of integration. To cope with such a problem, examination has been made to use, as a capacitor dielectric film, a high-dielectric-constant or ferroelectric material having a significantly large specific dielectric constant as compared with a prior art capacitor using silicon oxide or silicon nitride. In particular, it has been examined to apply the capacitor dielectric film using the high-dielectric-constant or ferroelectric material to a semiconductor device requiring a large capacitance with a reduced area, such as a large-scale DRAM in which the density of integration is in the order of gigabit. Further, since the high-dielectric-constant or ferroelectric material has a spontaneous polarization, the direction of which can be reversed by an external electric field applied thereto, an attempt has been made to form a non-volatile memory by making use of such a characteristic of the high-dielectric-constant or ferroelectric material. A prior art memory using the high-dielectric-constant or ferroelectric material has been described, for example, in Japanese Patent Laid-open No. Sho 63-201998.

The high-dielectric-constant or ferroelectric thin film used for the above memory is generally made from a composite metal oxide type high-dielectric-constant or ferroelectric material such as lead titanate zirconate ($Pb(Zr, Ti)O_3$) (hereinafter, referred to as "PZT"), or barium strontium titanate (($Ba, Sr)TiO_3$) (hereinafter, referred to as "BST").

A lower electrode (storage electrode) is generally made from a noble metal excellent in oxidation resistance, such as platinum, iridium or ruthenium for suppressing deterioration thereof due to heating at a crystallization temperature of 500° C. or more upon formation of the high-dielectric-constant or ferroelectric film. On the other hand, an upper electrode (plate electrode), which is usually formed after film formation of a composite metal oxide, is generally made from the same material as that of the lower electrode for enhancing an electrical symmetry, and to avoid reaction with the high-dielectric-constant or ferroelectric film at a heat-treatment step performed after formation of a capacitor, the upper electrode is often made from a noble metal such as platinum (for example, described in the specification of U.S. Pat. No. 5,005,102).

In the fabrication process for the above memory, however, since the process has a processing step carried out in a hydrogen atmosphere such as a step of forming an interlayer insulating film, if the electrode is made from an electrode material acting as a strong catalyst to reduction such as platinum, the oxide type high-dielectric-constant or ferroelectric material is reduced. This causes a significant deterioration in characteristics, such as the increase in leakage current or disappearance of the hysteresis characteristic.

For this reason, a process not to generate hydrogen has been selected at the sacrifice of the characteristic of an interlayer insulating film to some extent. However, it may be of course desirable to use a technique of forming an insulating film being good in coverage and resistance against etching. Further, even at the step of forming an interconnection after formation of a capacitor, hydrogen may be used, and to increase the degree of freedom in selection of the process, the capacitor using a high-dielectric-constant or ferroelectric film is required to be improved in terms of the resistance against hydrogen heat-treatment.

To be more specific, as described above, after formation of a high-dielectric-constant or ferroelectric film, the capacitor is subjected to treatment in a reducing atmosphere for forming an interconnection layer and an insulating film. Further, a through-hole formed for electrical connection between a peripheral circuit and an interconnection layer is generally formed into a shape in which a ratio of the depth to the size of the opening, that is, a so-called aspect ratio is large, and accordingly, tungsten or the like is formed by a CVD process in such a manner as to bury the through-hole. The CVD process is also performed in a reducing atmosphere.

It is known that the capacitor suffers a serious damage when being subjected to the above-described treatment in a reducing atmosphere. For example, in Material Research Society Symposium Proceedings Vol. 310, pp. 151–156 (1993), it was reported that when a $SiO_2$ film is formed by CVD, PZT as a high-dielectric-constant or ferroelectric material loses its ferroelectricity and increases the leakage current. Further, in the memory fabrication process, the memory is finally subjected to hydrogen heat-treatment (hydrogen annealing) for ensuring the reliabilities of a metal interconnection layer and a transistor formed in a layer under the capacitor. It is known that like the above step of forming an interlayer insulating film, the hydrogen annealing exerts an effect on the capacitor characteristics. For example, in the eighth International Symposium on Integrated Ferroelectrics, 11C (1996), it was reported that in the case of using $SrBi_2Ta_2O_3$ (hereinafter, referred to as SBT) as a high-dielectric-constant or ferroelectric material, when being subjected to treatment in a hydrogen atmosphere, the capacitor is peeled, or if not peeled, it causes significant deterioration in leakage current characteristic.

Disclosure of Invention (Solving Means)

To solve the above-described problems, according to the present invention, there is provided a high-dielectric-constant or ferroelectric capacitor including an upper electrode formed of a conductive film of iridium oxide or ruthenium oxide, characterized in that lead, bismuth or barium is added to iridium oxide or ruthenium oxide for reducing the catalytic action of iridium or ruthenium which is not oxidized and remains.

It was examined what kind of material should be used as an upper electrode for a high-dielectric-constant or ferroelectric capacitor capable of keeping its characteristics after the step in a hydrogen atmosphere. A double-layer film of platinum and titanium was formed as a lower electrode on a silicon substrate on which a thermally oxidized film was formed. A lead titanate zirconate thin film having a thickness of 100 nm was formed on the electrode by a sol-gel process. The sol used was obtained by reaction of lead acetate, titanium isopropoxide, and zirconium isopropoxide in methoxy ethanol. To obtain a perovskite type structure upon crystallization, 10% of lead oxide was excessively added thereto. The lead titanate zirconate thin film was subjected to rapid thermal annealing in an oxygen atmosphere at 650° C. for 2 minutes, to crystallize lead titanate zirconate. An upper electrode having a size of 100 µm×100 µm was formed on the lead titanate zirconate thin film by a lift-off process. The capacitor with upper electrode thus obtained was heat-treated in a hydrogen atmosphere at 300° C., and was examined in terms of the presence or absence of deterioration of the characteristics. To be more specific, four kinds of the capacitors including the upper electrodes made from platinum, iridium oxide, stacked layer of platinum and iridium oxide, and gold were examined. A ratio of the spontaneous polarization value after hydrogen heat-treatment to that before hydrogen heat-treatment for each capacitor was shown in Table 1.

As is apparent from Table 1, the deterioration of the characteristic of the capacitor is dependent on the kind of the upper electrode material, more specifically, becomes smaller in the order of platinum, stacked layer of platinum and iridium oxide, gold, and iridium oxide, and for the capacitor including the upper electrode made from iridium oxide, there is no deterioration of the characteristic shown.

TABLE 1

| upper electrode material | ratio (%) between residual polarizations before and after hydrogen heat-treatment |
|---|---|
| Pt | 5 |
| PT/IRO$_2$ | 7 |
| IrO$_2$ | 96 |
| Au | 72 |

From the results shown in Table 1, it was revealed that if the material having acted as a catalyst to reduction by hydrogen is used as the upper electrode, it causes the deterioration of the characteristic, and even if the material is not direct-contact with the lead titanate zirconate thin film like the stacked layer of platinum and iridium oxide, it promotes the deterioration of the characteristic. With respect to the deterioration of the characteristic caused in the case of using gold as the upper electrode, it was revealed that since such deterioration is substantially equal to that caused by heat-treatment in a nitrogen atmosphere at the same temperature, it is not due to reduction by hydrogen but is only the thermal deterioration.

In summary, the degree of deterioration by hydrogen heat-treatment is largely dependent on the kind of the upper electrode material, and by using iridium oxide which is a conductive oxide as the upper electrode, the deterioration can be effectively suppressed.

The above hydrogen heat-treatment was performed at 300° C. The test was then repeated by increasing the temperature of the hydrogen heat-treatment. As a result, it was confirmed that even the capacitor including the upper electrode made from iridium oxide was slightly deteriorated. This is because the reduction of iridium oxide begins by heat-treatment at a high temperature so that the catalytic action of iridium oxide emerges. Next, the upper electrode made from iridium oxide was formed and was heat-treated in an oxygen atmosphere, and then examined in terms of the deterioration preventive effect. The effect obtained by oxygen heat-treatment performed before hydrogen heat-treatment was shown in FIG. 1. As is apparent from FIG. 1, by previously heat-treating the upper electrode made from iridium oxide in an oxygen atmosphere at a temperature of 500° C. or more, the deterioration by hydrogen heat-treatment is effectively suppressed.

To clarify the effect obtained by oxygen heat-treatment, the electrode portion was measured by X-ray diffraction and X-ray photo-electron spectroscopy. The X-ray diffraction patterns of the electrode portion before and after oxygen heat-treatment were shown in FIG. 2. As is apparent from FIG. 2, the crystallinity of the iridium oxide film becomes improved with an increase in the oxygen heat-treatment temperature. Also from the result of the X-ray photo-electron spectroscopy, it was revealed that lead is diffused in the electrode made from iridium oxide. FIG. 3 shows the dependency of the oxygen heat-treatment temperature on the diffused amount of lead. As is apparent from FIG. 3, when the oxygen heat-treatment temperature becomes 500° C. or more, the diffusion of lead is rapidly emerged. It became apparent that the effect obtained by oxygen heat-treatment is that as the degree of oxidation of iridium oxide is increased, the reduction of iridium oxide upon hydrogen heat-treatment is suppressed by lead diffused from the lead titanate zirconate thin film, to thereby prevent the emergence of the catalytic action and the deterioration of the capacitor characteristics due to the emergence of the catalytic action.

Next, the additional effect of lead to the electrode made from iridium oxide was further examined. A lead added iridium oxide film was formed as the upper electrode by a manner of placing a desired amount of pellets of lead on an iridium metal target, and sputtering the composite target by a reactive sputtering process. FIG. 4 shows a relationship between the added amount of lead in the iridium oxide film (molar fraction of lead based on the iridium oxide) and the deterioration of the capacitor characteristics at the hydrogen heat-treatment temperature. As is apparent from FIG. 4, the deterioration suppressing effect is improved by adding lead even in an extremely small amount. When the added amount of lead reaches in a range of less than 10%, the effect is improved, however, when it is more than 10%, the effect is saturated and the resistance of the electrode portion is increased. Accordingly, the added amount of lead is preferably in a range of 10 mol % or less.

The same effect was obtained by a manner of forming the iridium oxide film and stacking a lead film thereon for subjecting to heat-treatment. In the method, the outermost surface portion may be lead oxide, however, in this case, the surface may be subjected to sputter-etching to remove the lead oxide.

While the above effect was obtained for the capacitor in which lead titanate zirconate was used for the high-dielectric-constant or ferroelectric thin film and iridium oxide was used for the upper electrode, the same effect was obtained for a capacitor in which bismuth layered high-dielectric-constant or ferroelectric material was used for the high-dielectric-constant or ferroelectric thin film. As the element to be added in iridium oxide, bismuth may be used in place of lead. Further, the same effect can be obtained for a capacitor in which barium strontium titanate was used for the high-dielectric-constant or ferroelectric film and ruthenium oxide was used for the upper electrode. Such a capacitor is easy to be applied to a DRAM because it does not exhibit the hysteresis characteristic at room temperature although it depends on the composition. Although the heat-treatment in a hydrogen atmosphere causes a problem in increasing the leakage current, it is possible to suppress an increase in leakage current by adding an element capable of making the reduction by hydrogen smaller. As the additional element in this case, barium may be used in place of lead.

Further, according to the present invention, an impurity is added in an upper electrode (electrode formed after formation of a high-dielectric-constant or ferroelectric film) of a capacitor, to make a hydrogen decomposition action of the electrode metal small. The additional element is desirable to be small in solubility in the metal used for the electrode. To be more specific, in the case of using platinum (Pt) as the upper electrode metal, examples of the desirable additional impurity elements may include sulfur (S), selenium (Se), tellurium (Te), silicon (Si), boron (B), phosphorus (P), arsenic (As), and bismuth (Bi).

In the case of the upper electrode made from a metal other than platinum or gold, the same effect can be obtained by adding lead (Pb) or barium (Ba) in place of the above-described impurity element. For example, in the case of the upper electrode made from any one of palladium, ruthenium, iridium and nickel in place of platinum, the same effect can be obtained by adding the above impurity.

Table 2 shows the solubility in platinum of each of the above elements, and compounds containing platinum in the largest amount amongst other compounds of platinum (the source: Binary Alloy Phase Diagrams, 2nd Ed., Thaddeus B. Massalski, Editor-in-chief, ASM International, 1990).

TABLE 2

| element | solubility in Pt | compound |
|---------|------------------|----------|
| S | <0.01% | PtS |
| Pb | hardly dissolved | $Pt_3Pb$ |
| Se | hardly dissolved | $Pt_5Se_4$ |
| Te | ~2 atom % | PtTe |
| Si | ~1.4 atom % | $Pt_3Si$ |
| B | ~1 atom % | $BPt_3$ |
| P | 0.03 atom % | $P_2Pt_5$ |
| As | hardly dissolved | $PtAs_2$ |
| Bi | hardly dissolved | BiPt |
| Be | hardly dissolved | $BaPt_5$ |

The solubility in platinum of each of the above additional elements is less than 10%. Accordingly, when platinum is crystallized into a polycrystalline state at the step of depositing a platinum layer or at the step of heat-treating the platinum layer after depositing step, most of the additional element are turned into a state near the compound shown on the right column of Table 2 and they cover the surfaces of polycrystalline grains of platinum. The catalytic activity on the surface of platinum is thus lowered. As a result, upon heat-treatment in a hydrogen atmosphere, occurrence of active hydrogen due to decomposition of hydrogen on the surface of platinum is suppressed, and thereby the deterioration of the capacitor characteristics and the peeling of the electrode are also suppressed. Further, since the concentration of the above impurity in platinum is small, there is no deterioration of the element characteristics due to an increase in electrical resistance of the entire platinum layer.

Even in the case of using, as the upper electrode material, palladium, ruthenium, iridium or nickel in place of platinum, the same effect can be obtained by adding the above impurity. It is known that of the above additional impurities, sulfur is an element of lowering the catalytic activity of platinum and palladium (described, for example, in H. P. Bonzel and R. Ku, The Journal of Chemical Physics, Volume 58, Number 10, page 4617–4624 (1973) and Y. Matsumoto et. al., Journal of Chemical Society Faraday I, Volume 76, page 1116–1121 (1980)). According to the present invention, the deterioration of the characteristics of the high-dielectric-constant or ferroelectric capacitor was prevented by positively utilizing the above effect.

A desirable amount of the above additional element will be described by referring to an example of platinum. In general, a platinum thin film used for the electrode is in a columnar polycrystalline state. It is assumed that a polycrystal grain of platinum has the shape of a column having a radius "r" and a height "h"; and the face density of the platinum atom on the surface of the column is equal to the value of the (100) face of the platinum crystal, which is taken as $2/a^2$. The volume density of the platinum atom in the column is $4/a^3$. The symbol "a" designates the lattice constant of the platinum crystal, which is 0.39 nm. On the above assumption, a ratio (s) of the number of the platinum atoms exposed on the surface of the column to the number of the platinum atoms in the entire column is given by an equation of $(r+h)a/r/h$. The height of the column may be regarded as a value nearly equal to the thickness of the platinum film, which is generally about 100 nm. The radius is generally 10 nm or more. Assuming that h=100 nm and r=10 nm, $S^{-4}$ atom % is obtained. Accordingly, by adding the element in an amount of several atom %, the element can sufficiently cover the platinum atoms on the surfaces of the polycrystal grains of platinum. It is not desirable to increase the amount of the additional element more than necessity since the electrical resistance of the platinum electrode is undesirably increased. Further, the additional element in an excessive amount may be diffused in the high-dielectric-constant or ferroelectric thin film to cause the deterioration of the dielectric characteristic or may be diffused in the insulating protective film to cause the deterioration of the insulating characteristic. These problems can be avoided by setting the added amount of the additional element in a range of 10 atom % or less. The same is true for the upper electrode made from any one of palladium, ruthenium, iridium, and nickel.

The present invention is intended to suppress the deterioration of the capacitor due to treatment in a hydrogen atmosphere which is performed after the upper electrode is formed to accomplish the capacitor, and therefore, it is essential to apply the present invention to the upper electrode of the two electrodes (lower electrode and upper electrode) constituting the capacitor. Since the permeation of hydrogen in the lower electrode is suppressed by the high-dielectric-constant or ferroelectric layer and the upper electrode, the advantage obtained by applying the present invention to the lower electrode is smaller than that obtained by applying the present invention to the upper electrode. In some cases, it may be rather desirable to use a metal layer to which the impurity is not added for the lower electrode for preventing the electrical resistance and the contact resistance with the underlying polysilicon layer from being increased due to the addition of the impurity.

As a result of the search for any known example on the basis of the above viewpoint, Japanese Patent Laid-open No. Hei 4-206871 was found. This document discloses a semiconductor device at least including a first electrode, a high-dielectric-constant or ferroelectric film, and a second electrode sequentially stacked on a substrate, characterized in that at least one of the first and second electrodes is composed of a platinum or gold electrode containing at least one kind selected from a group consisting of lead, barium, lanthanum, strontium, titanium and zirconium. In this technique, the same elements as those contained in the high-dielectric-constant or ferroelectric material are previously contained in the lower electrode for preventing occurrence of an inconvenience that the components of the high-dielectric-constant or ferroelectric material are diffused in Pt or Au constituting the lower electrode upon formation of the high-dielectric-constant or ferroelectric film, causing change in the composition of the high-dielectric-constant or ferroelectric material, thereby lowering the dielectric constant. The above document also describes that the elements may be contained even in the second electrode, however, it does not describe the problem caused in the case of using Pt for the upper electrode at all.

To fabricate a semiconductor device, hydrogen annealing is an essential process, however, it causes a problem in exerting adverse effect on the capacitor characteristics. Accordingly, it is important to solve such the problem for obtaining a semiconductor memory, particularly, at the level of gigabit or more.

As a result of examining the cause of deterioration due to treatment in a hydrogen atmosphere, it was revealed that platinum as the electrode material is concerned with the deterioration process.

A relationship between the state of the interface between Pt as the electrode material and PZT and the influence of hydrogen ($H_2$) annealing was examined by XPS (X-ray photoemission spectroscopy). A PZT thin film was prepared by ozone jet evaporation (OJE) in an ozone atmosphere. In a chamber connected to an analytical chamber, a Pt thin film was formed on the PZT thin film by electron beam vapor-deposition and was annealed, and the state of the interface between Pt and PZT of the Pt/PZT sample was subjected to in-vacuo XPS analysis. As a result, it was revealed that metal Pb is produced at the interface by annealing at 300° C.; the amount of metal Pb becomes larger when the Pt/PZT sample is subjected to $H_2$ (0.5 Torr) annealing; and the n-type Schottky barrier height at the Pt/PZT interface is lowered by about 0.6 V when the Pt/PZT sample is subjected to $H_2$ annealing (FIG. 20 shows a change in Pb4fXP spectrum of the PT/PZT sample, depending on annealing (300° C., 20 minutes)). The reason for this may be considered that H radicals produced by dissociation/absorption of $H_2$ on the surface of Pt strongly acts on the surface of PZT, with a result that the interfacial level due to oxygen vacancies is generated and thereby the Schottky barrier is lowered.

To be more specific, in the case of using platinum (Pt) as the electrode material, hydrogen is decomposed on the surfaces of polycrystal grains of Pt, and active hydrogen is produced by the catalytic action of Pt. The active hydrogen deteriorates the high-dielectric-constant or ferroelectric material. This is the reason why the capacitor characteristics are deteriorated and the electrode is peeled at such a low temperature (for example 300° C.) at which the high-dielectric-constant or ferroelectric material is not generally reduced to be deteriorated.

As a result, it is required to eliminate the catalytic activity of Pt for preventing the deterioration of the Pt/PZT interface due to $H_2$ annealing and occurrence of damages of the high-dielectric-constant or ferroelectric film due to hydrogen.

(Effect)

As described above, for an oxide high-dielectric-constant or ferroelectric capacitor using an electrode made from platinum, hydrogen dissociated from a raw material at the passivation step becomes active by the catalytic action of the electrode and reduces the high-dielectric-constant or ferroelectric material, thereby deteriorating the capacitor characteristic. A conductive iridium oxide layer used in the present invention, however, is weak in terms of catalytic action, and therefore, it does not make hydrogen active to reduce the high-dielectric-constant or ferroelectric material. Further, an additional element and its oxide function to suppress emergence of the catalytic action of the electrode due to reduction.

Even in the case of using platinum or the like as the material of an upper electrode, a desirable result can be obtained by adding a suitable impurity such as sulfur (S).

BEST MODE FOR CARRYING OUT THE INVENTION (First Embodiment)

An example will be described in which a memory cell is formed using iridium oxide for an upper electrode and lead titanate zirconate for a dielectric film.

Figure 12:
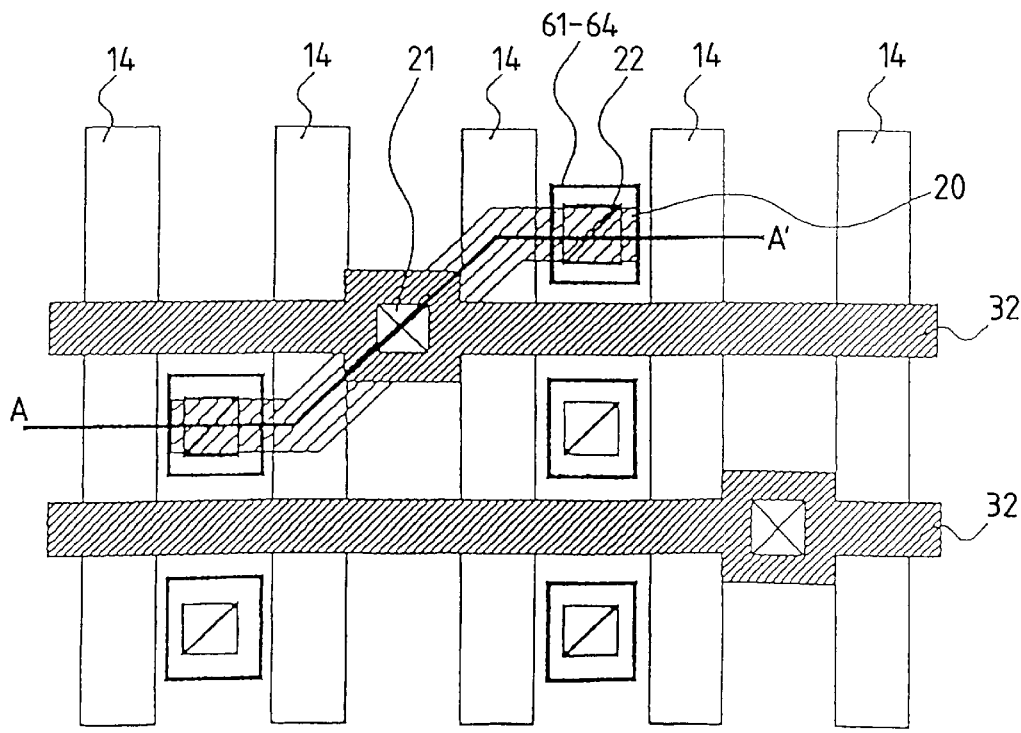
FIG. 12 is a plan view showing the first embodiment of the present invention.

FIGS. 5 to 10 show steps of fabricating a memory cell in this embodiment; and FIG. 12 is a plane view of the memory cell. This embodiment employs a memory cell structure described in Japanese Patent Laid-open No. Hei 3-256356, and a storage capacity portion of a flat structure.

Figure 1:
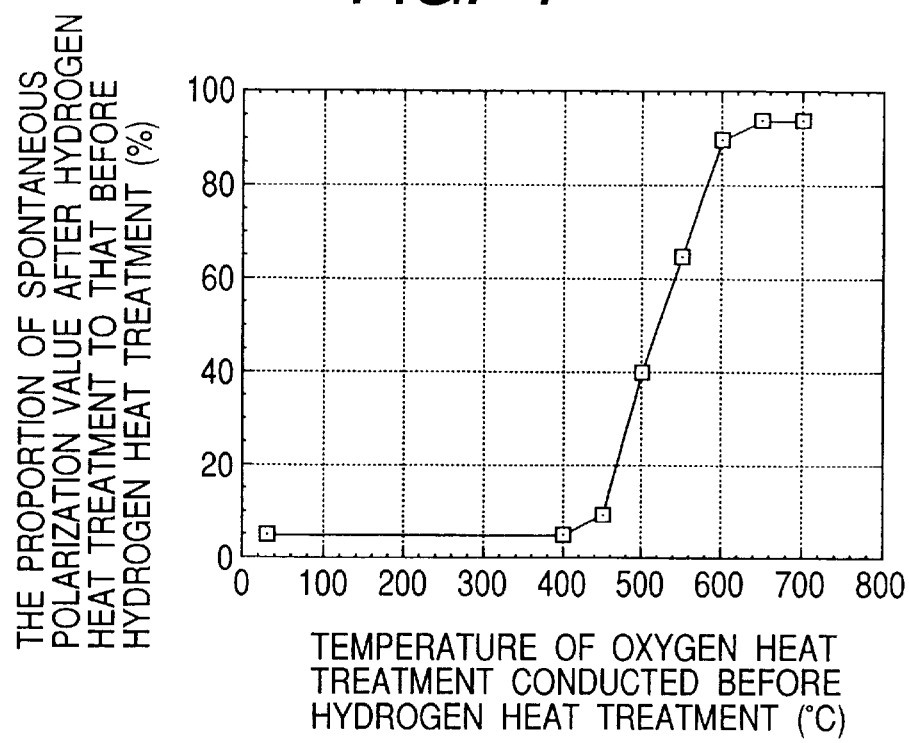
FIG. 1 is a diagram showing the effect of the present invention.
Figure 2:
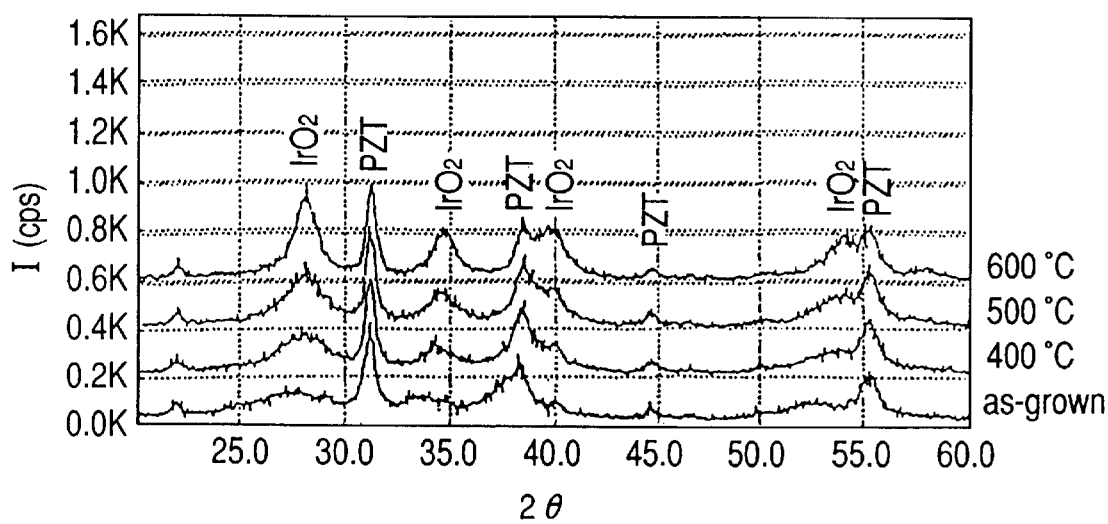
FIG. 2 is a diagram showing the effect of the present invention.
Figure 3:
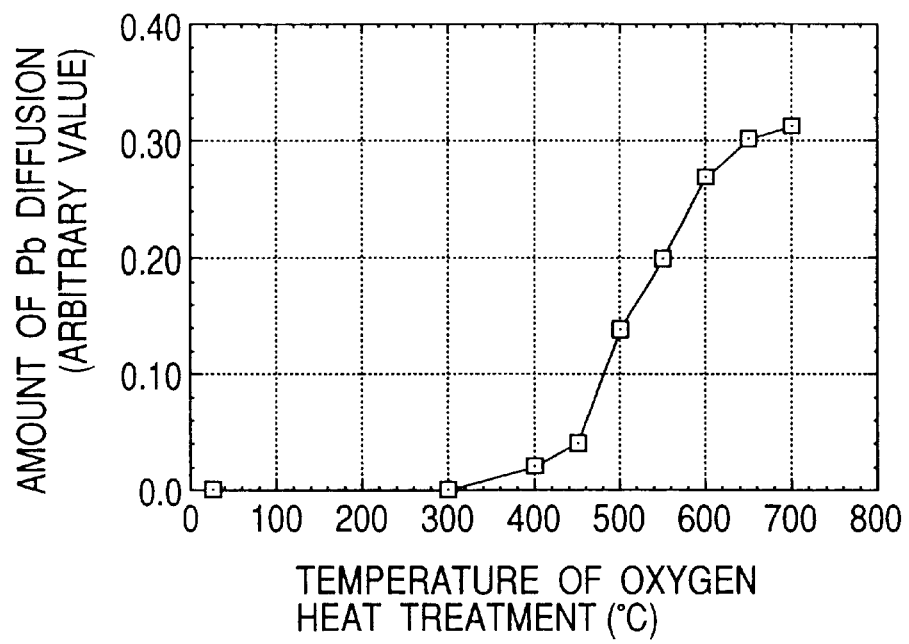
FIG. 3 is a diagram showing the effect of the present invention.
Figure 4:
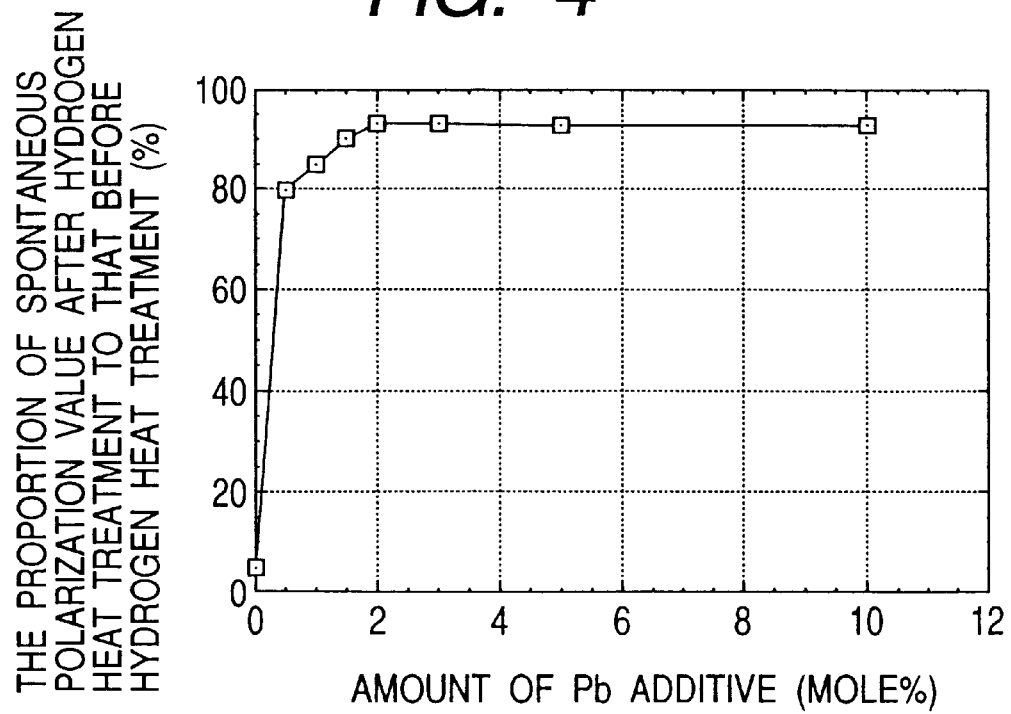
FIG. 4 is a diagram showing the effect of the present invention.
Figure 5:
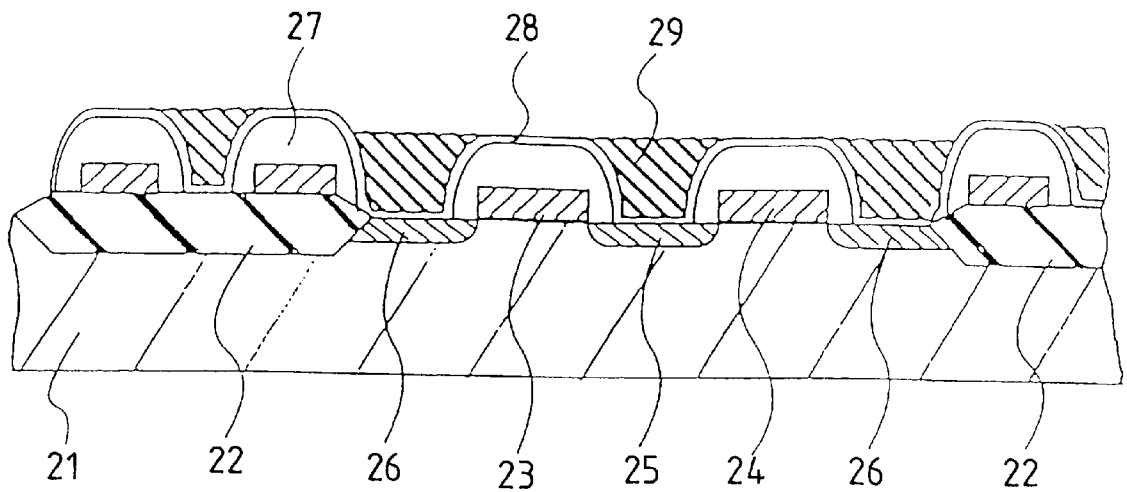
FIG. 5 is a view showing a fabrication step according to a first embodiment of the present invention.

First, as shown in FIG. 5, a switching transistor was formed in accordance with a prior art MOSFET formation step. In FIG. 5, reference numeral 21 designates a p-type semiconductor substrate; 22 is a field isolation insulating film; 23 is a gate oxide film; 24 is a word line taken as a gate electrode; 25 and 26 are n-type impurity (phosphorus) diffusion layers; and 27 is an interlayer insulating film. A $SiO_2$ film 28 having a thickness of 50 nm and a $Si_3N_4$ film 29 having a thickness of 600 nm were sequentially deposited on the entire surface of the substrate in accordance with a known CVD process. The $Si_3N_4$ film 29 was then etched back to bury the insulating film between the word lines. The $SiO_2$ film 28 functions as an underlying film to prevent the surface of the substrate from exposing and the field isolation insulating film from scraping off when a bit line is formed at the subsequent step.

Figure 6:
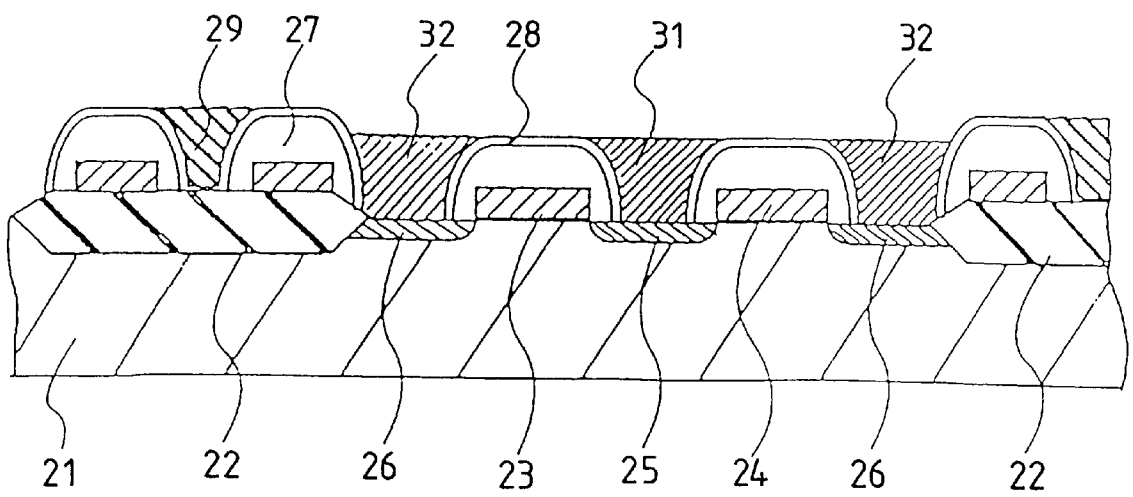
FIG. 6 is a view showing a fabrication step according to the first embodiment of the present invention.

Next, as shown in FIG. 6, a portion 25 at which a bit line is to be in contact with the n-type diffusion layer in the surface of the substrate and a portion 26 at which a storage electrode is to be in contact with the n-type diffusion layer in the surface of the substrate were opened in accordance with a known photo-lithography process and a known dry-etching process. Then, polysilicon doped with an n-type impurity was deposited to a thickness of 600 nm by the CVD process, followed by etching-back, to bury the openings formed by the above dry-etching with polysilicon 31 and 32.

Figure 7:
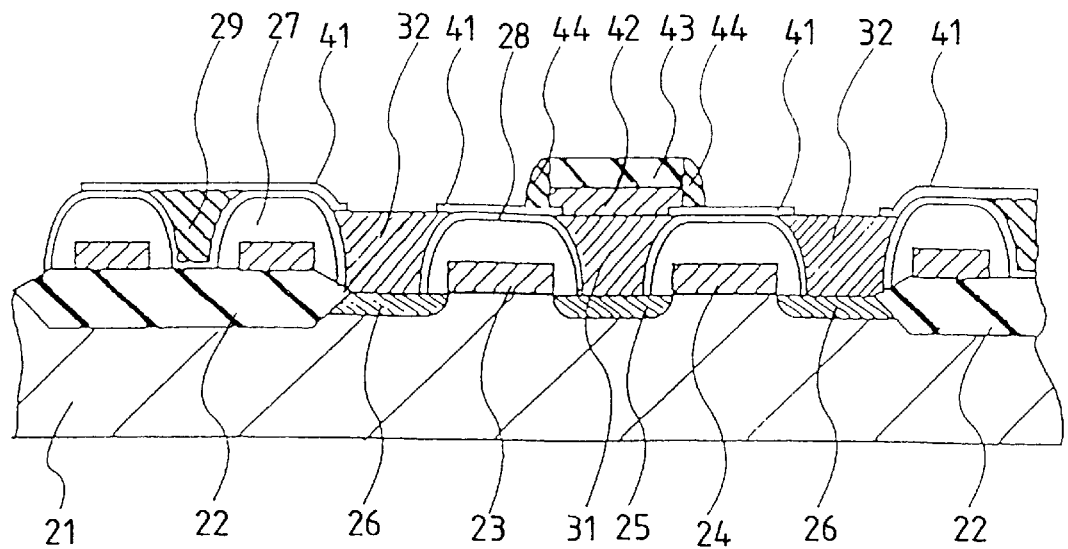
FIG. 7 is a view showing a fabrication step according to the first embodiment of the present invention.

An insulating film 41 was deposited on the entire surface of the substrate by the known CVD process, and to electrically connect a bit line to the diffusion layer 25, a portion of the insulating film 41, placed on the polysilicon portion 31, was opened by the known photo-lithography process and the known dry-etching process and then a bit line 42 was formed as shown in FIG. 7. The bit line 42 was formed of a stacked film of a metal silicide layer and a polysilicon layer. A $SiO_2$ film 43 having a thickness of 200 nm was deposited on the bit line 42. Both the $SiO_2$ film 43 and the bit line 42 were processed into a specific shape by the known photo-lithography and the known dry-etching, to thus form the bit line 42 into a desired pattern.

A $Si_3N_4$ film having a thickness of 150 nm was deposited by the CVD process, and was selectively etched by the dry-etching process to form side wall spacers 44 of $Si_3N_4$ on the side walls of the bit line, thereby insulating the bit line. A portion of the insulating film 41, placed on the polysilicon portion 32, was opened by the known photo-lithography and the known dry-etching process.

Figure 8:
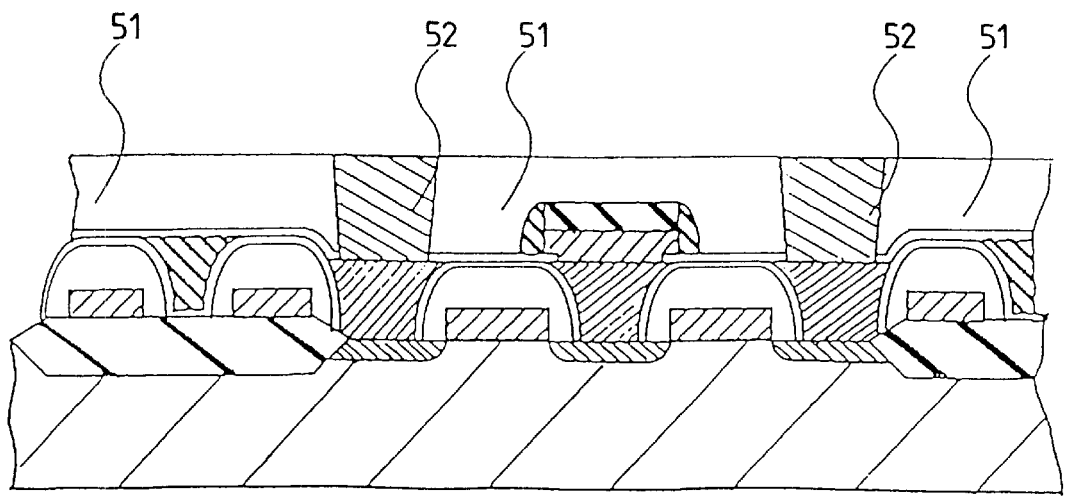
FIG. 8 is a view showing a fabrication step according to the first embodiment of the present invention.

An insulating film 51 made from a silicon oxide based material such as BPSG was deposited, and then the surface of the insulating film 51 was planarized in accordance with a known process. The thickness of the insulating film 51 is required to be large enough to cover the surface of the substrate for planarizing. In this embodiment, the thickness of the insulating film 51 was set at 500 nm. Alternatively, a method may be adopted in which a $SiO_2$ film is deposited on the surface of the substrate by the CVD process and is then planarized by the etch-back process. As shown in FIG. 8, specific portions of the insulating film 51 were opened by the known photo-lithography and the known dry-etching to form contact holes, and a phosphorus doped amorphous silicon film 52 for burying was deposited to a thickness of 200 nm and was etched-back by the known dry-etching process. The contact holes were thus buried with the phosphorus doped amorphous silicon film 52.

Figure 9:
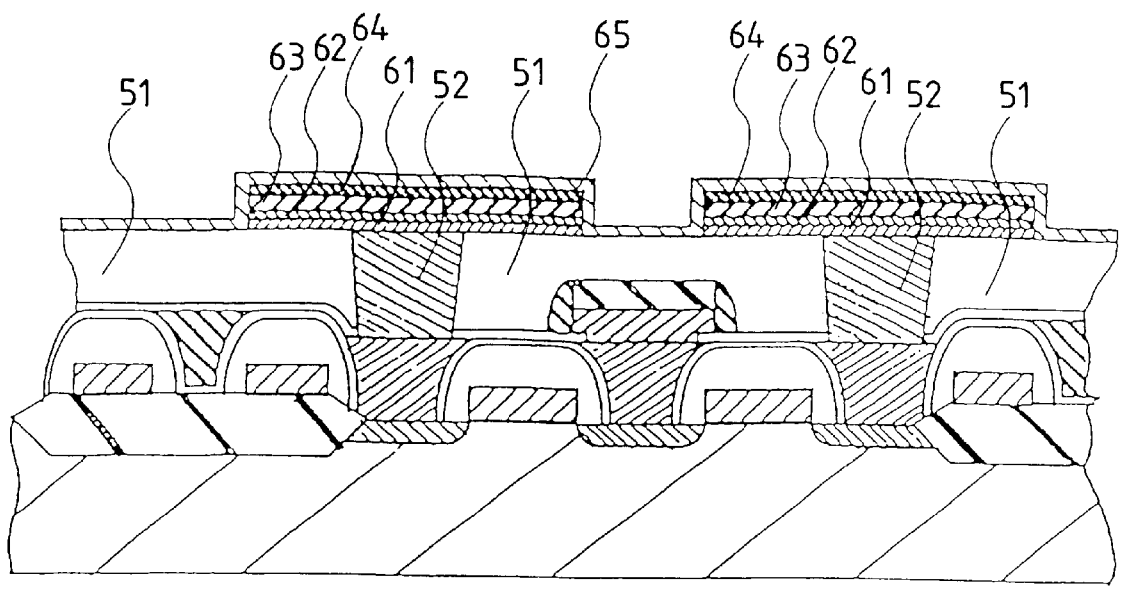
FIG. 9 is a view showing a fabrication step according to the first embodiment of the present invention.
Figure 10:
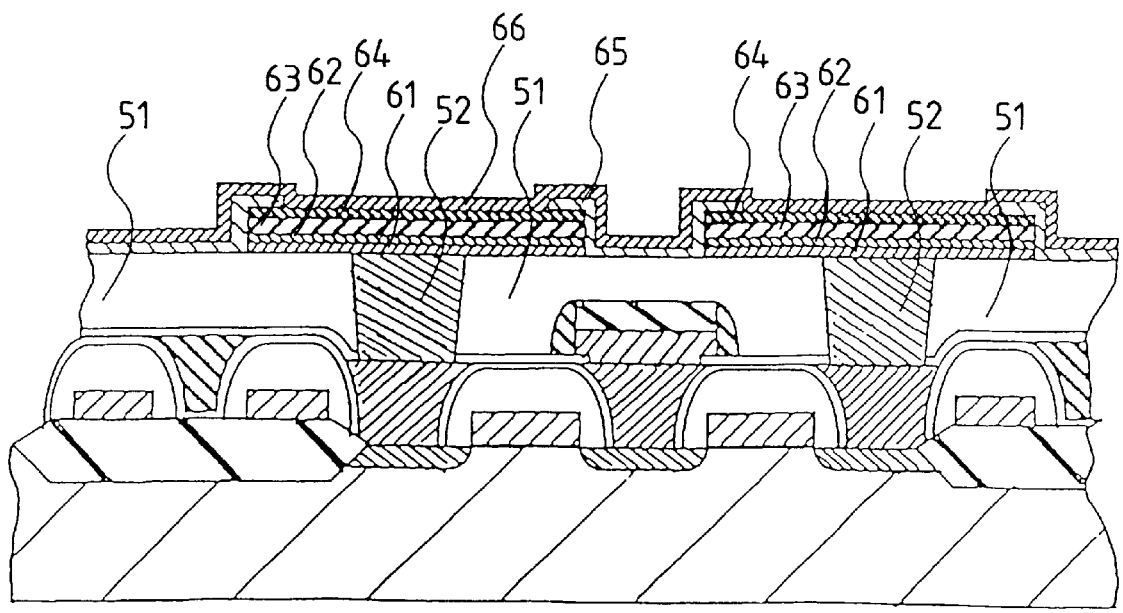
FIG. 10 is a view showing a fabrication step according to the first embodiment of the present invention.

As shown in FIG. 9, a TIN film 61 having a thickness of 100 nm functioning as a diffusion preventive film was formed, and then a platinum underlying electrode 62 was formed thereon. A lead titanate zirconate $(Pb(Zr_{0.5}Ti_{0.5})O_3)$ thin film having a thickness of about 100 nm was formed on the platinum underlying electrode 62 by a sol-gel process, and was then heat-treated in an oxygen atmosphere at 650° C. for 120 seconds, to be thus crystallized. A plate electrode 64 made from iridium oxide containing lead was deposited on the lead titanate zirconate thin film. The iridium oxide film containing lead was formed in a manner of placing a desired amount of lead pellets on an iridium target, and sputtering the composite target in an oxygen containing atmosphere to allow atoms of the composite target to react with oxygen. The upper electrode mainly containing iridium oxide, the lead titanate zirconate thin film, and the lower electrode made from platinum and titanium nitride were sequentially patterned to form a capacitor of a memory cell. A passivation film made from plasma TEOS was formed on the capacitor. Then, as shown in FIG. 10, the passivation film was opened, to form an opening to contact with the upper electrode, and the opening was buried with a tungsten film to form a first interconnection. The dielectric characteristic of the capacitor portion was evaluated in such a state. To be more specific, the capacitor characteristic of the capacitor (upper electrode: iridium oxide) after formation of the passivation film was compared with the capacitor characteristic of the capacitor (upper electrode; iridium oxide) before formation of the passivation film, and the capacitor characteristic of the capacitor (upper electrode: platinum) after formation of the passivation film. In addition, as the capacitor before formation of the passivation film, a large-sized test capacitor was used for evaluating the characteristic by contact with the upper electrode via a probe.

Figure 11:
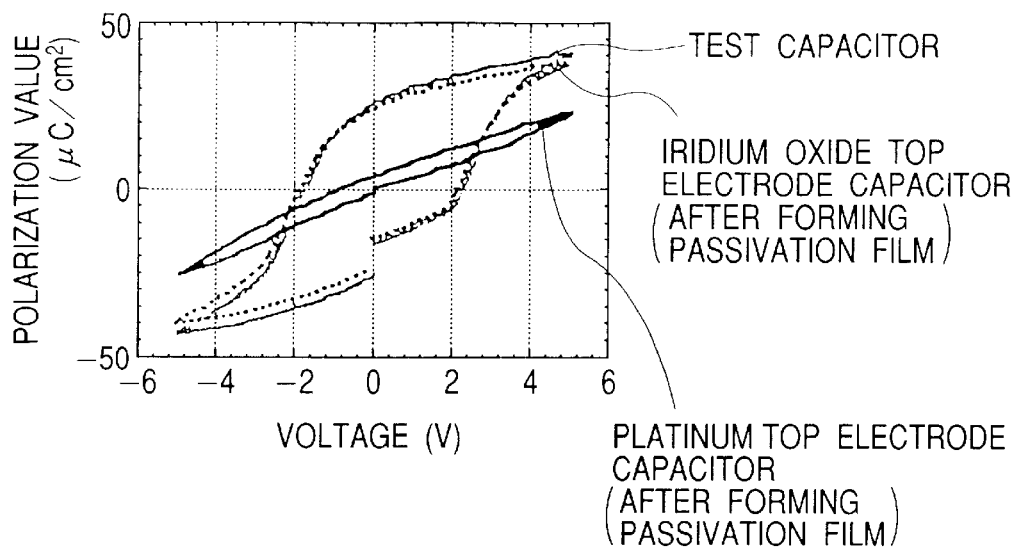
FIG. 11 is a diagram showing the effect of the present invention.

The hysteresis curves of the above capacitors were comparatively shown in FIG. 11. The capacitor using the upper electrode made from platinum does not indicate the hysteresis characteristic. On the contrary, the capacitor array using the upper electrode made from iridium oxide indicates a hysteresis curve which is comparative to that of the test capacitor, that is, the capacitor before formation of the passivation film.

As a result, it was confirmed that the use of a conductive oxide, which does not act as a catalyst to reduction by hydrogen, as the material of the upper electrode can suppress the deterioration of the capacitor at the passivation film forming step carried out in a reducing atmosphere. Further, as a result of heat-treating the capacitor in a hydrogen atmosphere at 400° C. and then evaluating the characteristic of the capacitor, the capacitor was not deteriorated. Accordingly, it was confirmed that the use of the above conductive oxide as the material of the upper electrode can also prevent deterioration of the capacitor during hydrogen heat-treatment.

The capacitor is preferably heat-treated in an oxygen atmosphere at 600° C. before being subjected to hydrogen heat-treatment because not only the characteristic of the capacitor is improved but also the effect of suppressing reduction by hydrogen is improved by the heat-treatment in an oxygen atmosphere. The film mainly containing iridium oxide, formed as the upper electrode, is good in adhesion with an oxide high-dielectric-constant or ferroelectric material such as lead titanate zirconate, and therefore, there is no fear that the film is peeled therefrom by heat-treatment after formation of the capacitor. Further, as shown in FIG. 11, there is no problem presented that the upper and lower electrodes become asymmetrical because they are made from the different materials.

(Second Embodiment)

Figure 13:
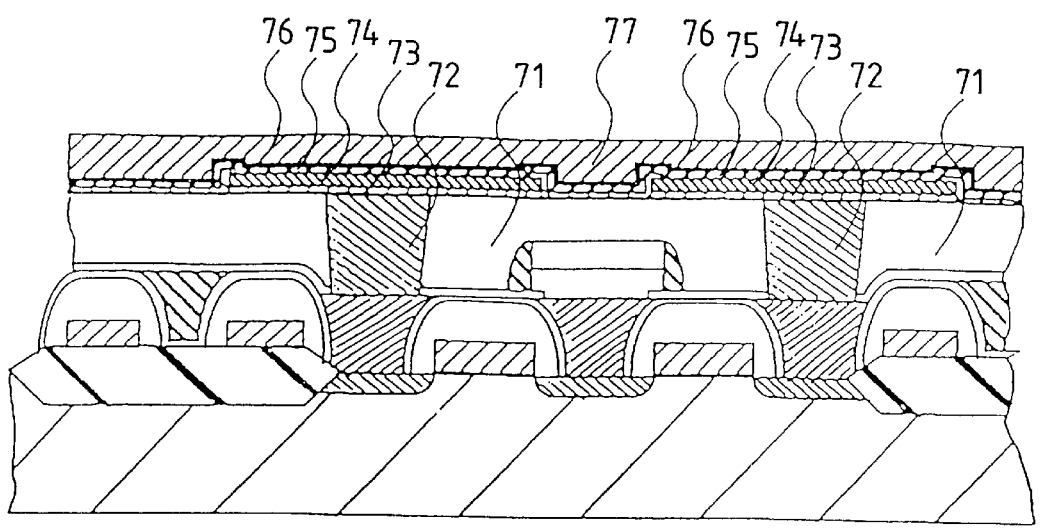
FIG. 13 is a sectional view showing a second embodiment of the present invention.

A second embodiment having a different memory cell structure will be described with reference to FIG. 13. A titanium oxide layer functioning as a reaction preventive layer was provided on an interlayer insulating film 71 under a capacitor. Specific portions of the titanium oxide film and the interlayer insulating film 71 were etched to form openings, and the openings were buried with titanium nitride as plugs 72. Followed by forming a platinum film, and then finely patterned using the titanium nitride portions as a mask, to form lower electrodes 74. A lead titanate zirconate film 75 was formed over the entire surface, and an upper electrode 76 made from iridium oxide was formed thereon. The iridium oxide film was divided as plate lines, and after formation of a passivation film, openings were provided and interconnections were led to the plate lines via the openings.

At this time, a portion to be in contact with each plate line was set to be outside the capacitor portion. The opening for the contact with the plate line is not shown in FIG. 13.

With this structure, even if a metal acting as a catalyst to reduction by hydrogen is used as a wiring material on the upper side of the iridium oxide film, since the wiring material is not stacked directly on the iridium oxide film, there is no fear that the capacitor is deteriorated when being subjected to hydrogen heat-treatment at the subsequent step.

(Third Embodiment)

Figure 14:
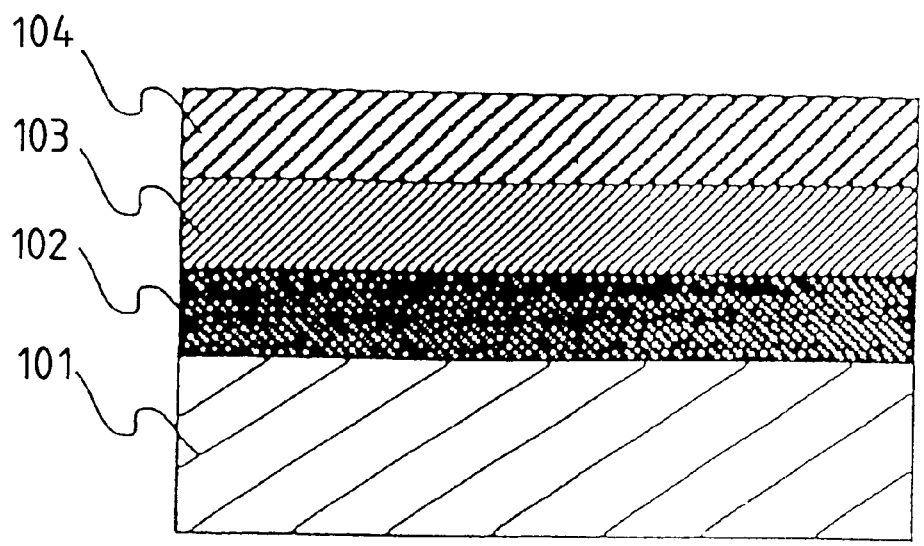
FIG. 14 is a sectional view showing a third embodiment of the present invention.

A third embodiment of the present invention will be described with reference to FIG. 14.

In a capacitor according to this embodiment, a lower electrode 102 and a high-dielectric-constant or ferroelectric thin film 103 were formed on an element layer containing part of a transistor or a supporting metal 101, and a platinum layer 104 to which lead was added was formed as an upper electrode on the high-dielectric-constant or ferroelectric thin film 103. Lead added to the platinum layer 104 is precipitated at grain boundaries of the platinum layer to form a platinum compound in such a manner as to cover crystal grains of platinum. With such a function of lead added to the platinum layer 104, it is possible to suppress occurrence of active hydrogen due to decomposition of hydrogen on the surface of platinum upon treatment in a hydrogen atmosphere and hence to prevent deterioration and peeling at the interconnection formation step of the high-dielectric-constant or ferroelectric capacitor or the like and it is proved that the long-term reliability was also improved.

In addition, the term "element layer containing part of a transistor" means one element constituting part of a MOS transistor, for example, a source region (source semiconductor layer) or a drain region (drain semiconductor layer). The term "lower electrode" means an electrode formed before formation of the high-dielectric-constant or ferroelectric film, and the term "upper electrode" means an electrode formed on the surface of the high-dielectric-constant or ferroelectric film after formation of the dielectric film.

A polarization-electric field characteristic of a capacitor prepared in this embodiment will be described below. The capacitor was prepared in accordance with the following procedure. As shown in FIG. 14, a platinum film 102 having a thickness of 100 nm was formed as a lower electrode on an element layer 101 containing part of a transistor by a DC sputtering process. Then, PZT was deposited to a thickness of 50 nm by a high-frequency sputtering process, followed by heat-treatment in oxygen at 650° C., to form a high-dielectric-constant or ferroelectric layer 103.

Next, platinum was vapor-deposited by an electron beam vapor-deposition process and simultaneously lead was vapor-deposited by a resistance heating process, to form a lead added platinum layer 104 having a thickness of 100 nm. At this time, the vapor-deposition rates of platinum and lead were adjusted such that the added amount of lead was 8 atom %.

Figure 15:
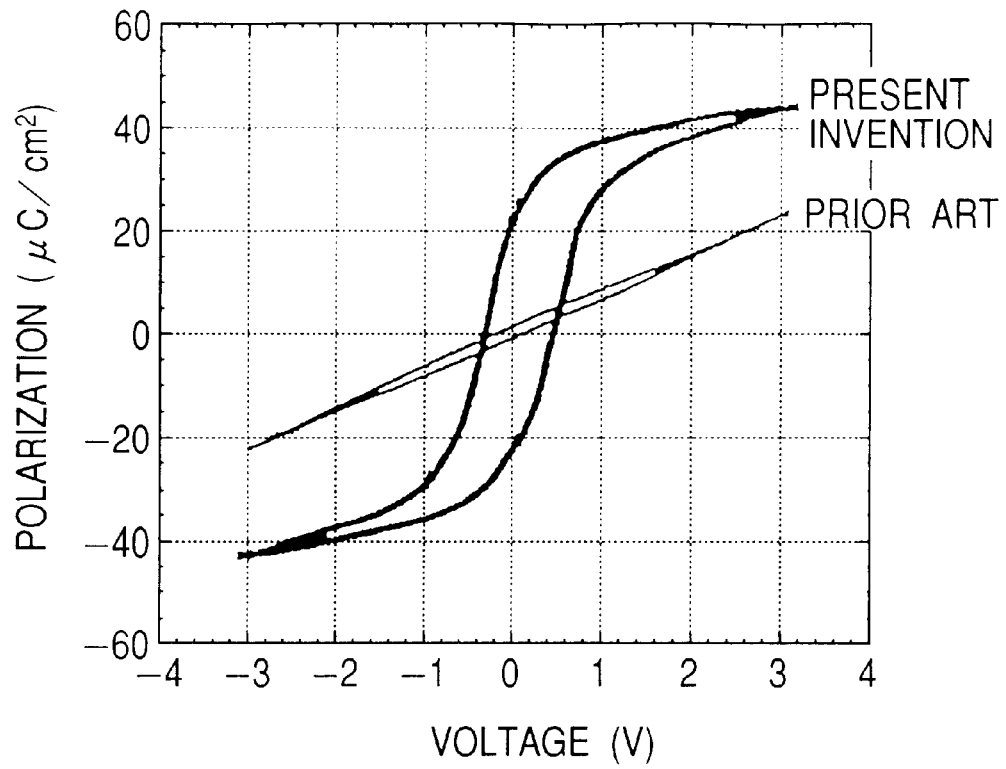
FIG. 15 is a diagram showing the effect of the present invention.

The polarization-electric field characteristic of the capacitor having the above structure thus obtained is shown in FIG. 15. The characteristic of the capacitor in this embodiment, which has been subjected to treatment at 350° C. for 30 minutes was compared with that of the prior art capacitor using the upper electrode made from platinum to which an impurity was not added, which has been subjected to the same treatment. As is apparent from FIG. 15, while the prior art capacitor loses the hysteresis characteristic as the polarization-electric field characteristic, the capacitor in this embodiment holds a specific hysteresis characteristic.

Further, when being subjected to hydrogen treatment at 400° C., the prior art capacitor caused peeling of the upper electrode, however, the capacitor in this embodiment did not cause such peeling and it was observed to have caused only slight deterioration in withstand voltage and dielectric characteristic.

(Fourth Embodiment)

A fourth embodiment of the present invention will be described with reference to FIG. 16. An active element layer 101 containing part of a transistor was formed by a known process, and a platinum film 102 having a thickness of 100 nm was formed as a lower electrode on the active element layer 101 by the DC sputtering process. Next, while the substrate was heated to 500° C., BST was deposited on the platinum film 102 to a thickness of 50 nm by the high-frequency sputtering process, followed by heat-treatment in oxygen at 650° C., to form a high-dielectric-constant or ferroelectric layer 301. Then, a lead added platinum film 302 having a thickness of 100 nm was formed as an upper electrode on the high-dielectric-constant or ferroelectric film 301. The added amount of lead was set at 8 atom %.

Figure 16:
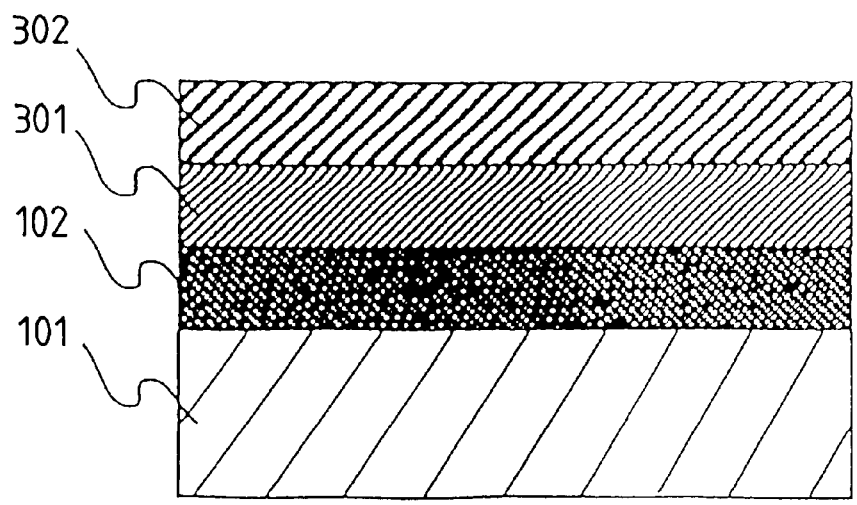
FIG. 16 is a sectional view showing a fourth embodiment of the present invention.

The capacitor having the structure shown in FIG. 16 was subjected to hydrogen treatment (400° C. for 30 minutes), and was examined in terms of a change in capacitance with an elapsed time in a state in which an alternating electric field was applied to the capacitor. The results were shown in FIG. 17.

Figure 17:
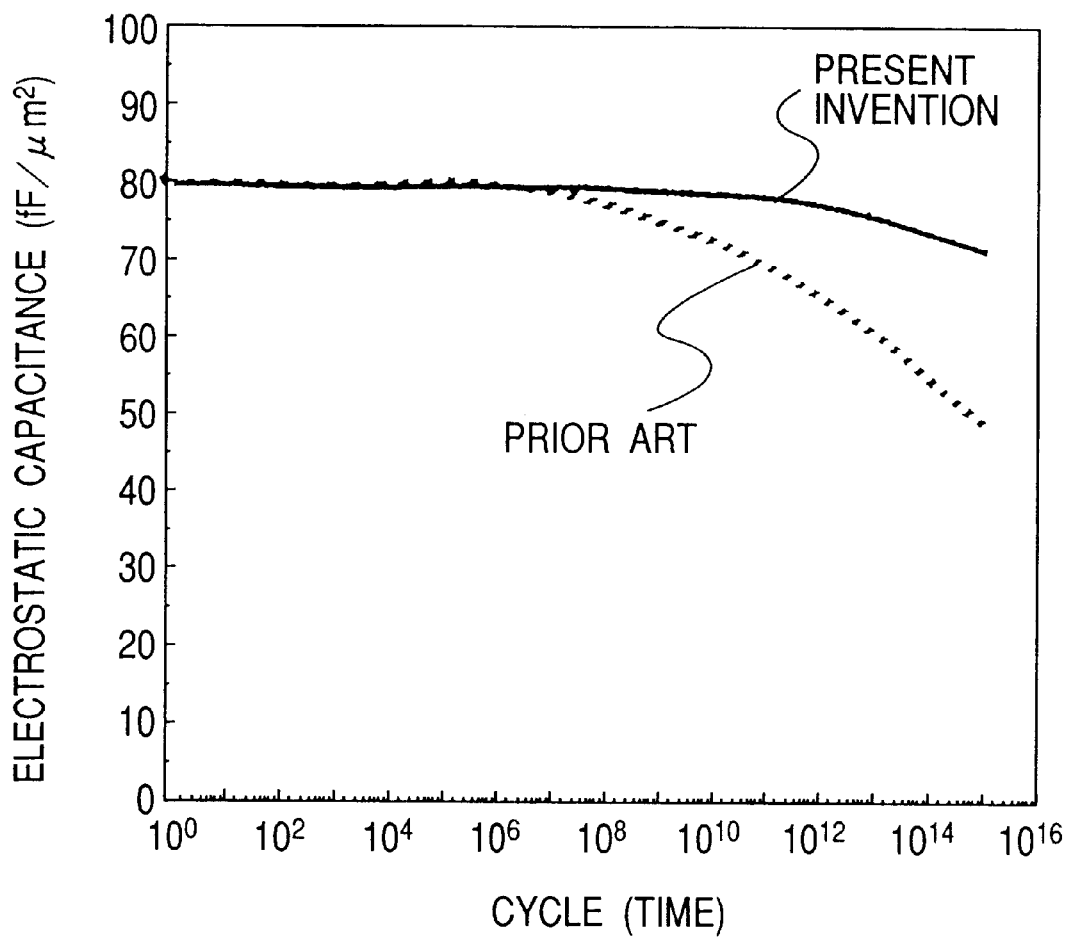
FIG. 17 is a diagram showing the effect of the present invention.

As is apparent from FIG. 17, for the prior art capacitor (using the upper electrode made from platinum to which an impurity is not added) shown for comparison, the capacitance was not changed at the initial stage but was significantly deteriorated due to the applied alternating electric field. As a result, it was confirmed that the prior art capacitor cannot ensure the reliability required for a semiconductor memory device. on the contrary, for the capacitor of the present invention, the capacitance was only slightly deteriorated due to the applied alternating electric field. As a result, it was confirmed that the capacitor of the present invention can ensure the reliability required for a semiconductor memory device.

In this embodiment, description has been made use of lead employed as an additional element, however, sulfur may be used in place of lead. Sulfur is little dissolved in platinum in a solid state like lead, and is precipitated at grain boundaries of platinum to form a platinum compound (PtS). Even in this case, like the above-described case using lead, there can be obtained the effect of highly preventing decomposition of hydrogen. Additionally, since PtS is thermally stable as compared with lead, it exhibits an advantage in which the above effect is hard to be lost at the heat-treatment step upon preparation of the element.

Selenium and tellurium, which are the group VI elements just like sulfur, may be added. Even in this case, an effect being substantially the same as that described above can be obtained. Also silicon, which is the group IV element just like lead, may be added. In particular, in the case of preparing an active element containing part of a transistor is made from silicon, silicon may be used as the additional element because there is no fear that the additional element diffused in the active element causes a variation in characteristics. However, since silicon is larger in solubility to platinum than lead or sulfur and is liable to be oxidized, it has a disadvantage that the electrical resistance of the electrode tends to be increased. Phosphorus, arsenic, bismuth, boron and barium, which are the group VI elements, may be used. In particular, if the main component of the high-dielectric-constant or ferroelectric material is bismuth or barium, the use of bismuth or barium as the additional element has an advantage that if the element is diffused on the high-dielectric-constant or ferroelectric material side at the heat-treatment step, the high-dielectric-constant or ferroelectric material side is less affected.

In this embodiment, description has been made of the case using platinum as the main component of the upper electrode material, however, any one of ruthenium, iridium, palladium or nickel, or an alloy containing any one of the elements stated above may be used as the main component of the upper electrode material. In such a case, the same effect as that described above can be obtained.

Additionally, in this embodiment, BST and PZT are used as the high-dielectric-constant or ferroelectric materials, however, other oxide high-dielectric-constant or ferroelectric materials mainly containing one kind selected from a group consisting of barium, lead, strontium, and bismuth may be effectively used. Examples of these oxide high-dielectric-constant or ferroelectric materials may include strontium titanate ($SrTiO_3$), lead titanate ($PbTiO_3$), lead barium titanate zirconate ($(Ba, Pb)(Zr, Ti)O_3$), lead barium niobate ($(Ba, Pb)Nb_2O_6$), bismuth strontium tantalate ($SrBi_2Ta_2O_9$), and bismuth titanate ($Bi_4Ti_3O_{12}$).

(Fifth Embodiment)

Next, an embodiment in which the present invention is applied to a semiconductor memory device will be described.

Figure 18:
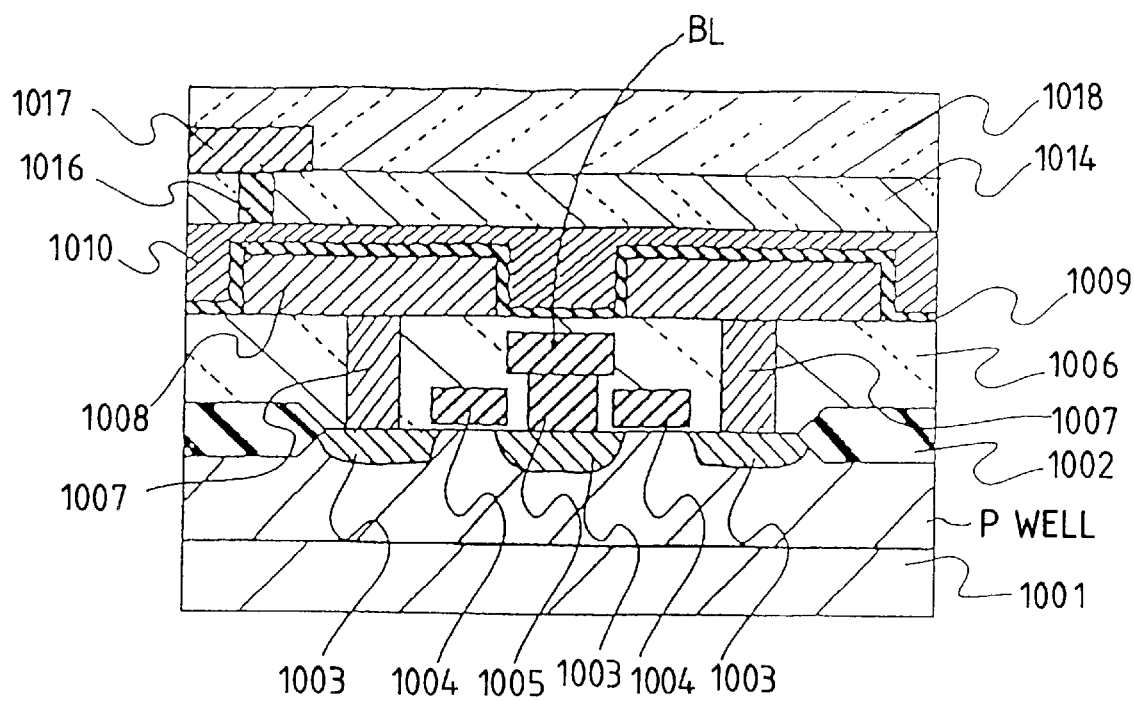
FIG. 18 is a sectional view showing a fifth embodiment of the present invention.

FIG. 18 shows an example of a DRAM in which BST is used as a high-dielectric-constant or ferroelectric material. A typical configuration of a memory cell in the DRAM is that one switching MISFET (metal-insulator semiconductor field effect transistor) is vertically connected to one capacitor for storing electrical charges. FIG. 18 shows two bits in which the memory cell is disposed in such a manner as to be right-left symmetrical.

A P-well was selectively formed in a principal plane region of a Si substrate 1001, and transistors (MISFETs) were formed on the principal plane of the P-well by a known process. To be more specific, field isolation insulating films 1002 were selectively formed in the surface portion of the P-well. Polysilicon gate electrodes 1004 as word lines were formed via a gate oxidized film in a region of the P-well partitioned by the field isolation insulating films 1002. Then, source/drain semiconductor regions, that is, n-type conductive impurity diffusion layers 1003 were formed in the P-well in self-alignment with spaces (not shown) provided on the side walls of the gate electrodes 1004.

A polysilicon (plug) interconnection 1005 connected to the impurity diffusion layer 1003 taken as the drain was formed on the surface of the P-well. A bit line (BL) was formed on the polysilicon interconnection 1005, and an interlayer insulating film 1006 was formed on the principal plane of the P-well provided with the bit line.

Portions of the interlayer insulating film 1006 were opened by the known photo-lithography in such a manner that the impurity diffusion layers taken as sources were partially exposed, to form openings. Conductive plugs 1007 for electrically connecting the impurity diffusion layers 1003 of the transistor to capacitor portions were formed in the openings. The conductive plug 1007 may be composed of a stacked film of titanium nitride/titanium silicide or a stacked film of titanium nitride/polysilicon formed by the CVD process.

Next, a platinum film having a thickness of 100 nm was formed by the DC sputtering process, and was processed into a specific shape by an argon sputtering process using a mask pattern formed by the known photo-lithography, to form platinum lower electrodes 1008 functioning as storage electrodes.

A BST film 1009 was then formed. The film is preferably formed in accordance with a CVD process including the step of thermally decomposing an alcholate or a complex of barium, strontium and titanium in oxygen. The film is more preferably formed in accordance with a CVD process using barium-dipyvaroyle methanate ($Ba(DPM)_2$), strontium dipyvaroyle methanate ($Sr(DPM)_2$), or titanium isopropoxide ($Ti(i-OC_3H_7)_4$).

The above raw material was stored in a heat reserving vessel, being heated at a temperature ranging from 150° C. to 250° C. for $Ba(DPM)_2$ or $Sr(DPM)_2$, or at a temperature ranging from 30° C. to 60° C. for $Ti(i-OC_3H_7)_4$ in order to allow the raw material to have a suitable vapor pressure, and was fed to a reaction furnace with the aid of argon bubbling. At the same time, oxygen was supplied to the reaction furnace. The raw material thus fed together with oxygen in the reaction furnace was thermally decomposed on the substrate heated at a temperature ranging from 400° C. to 700° C., to be thus oxidized. The thickness of the BST film was set at 20 nm. A lead added platinum layer having a thickness of 100 nm was formed as a plate electrode, that is, an upper electrode layer 1010 by the sputtering process as same as that used for a target, platinum to which lead was added. In this case, depending on the aspect ratio of a groove between the lower electrodes 1008, it is required to adopt the sputtering process intended to allow the sputtered particles of platinum to have directivity in combination with the etching-back process. In addition, as shown in FIG. 18, the upper electrode 1010 in this embodiment is not required to be divided into parts corresponding to respective information bits, that is, it can be configured to cover the capacitor over a plurality of bits. With this structure, the fine processing of, for example, the control gate of a MOS transistor can be performed not with the minimum dimensional accuracy at present but with a loosened dimensional accuracy.

After formation of the capacitor as described above, an interlayer insulating film 1014 having a thickness of 200 nm was formed by the known plasma CVD process using tetraethoxysilane (TEOS). Then, an electrical connection hole 1016 was formed in the interlayer insulating film 1014 by the known dry-etching process, and was filled with tungsten by a known hydrogen reduction blanket tungsten CVD process. A connection plug was thus formed in the connection hole 1016. The above tungsten CVD process was carried out using tungsten hexafluoride and hydrogen as source gases for about 30 sec at a substrate temperature of 400° C. and a pressure of 0.5 Torr. For the capacitor using the upper electrode made from platinum to which the impurity was not added, the withstand voltage thereof was deteriorated by this CVD.

After formation of the tungsten connection plug, the surface of the substrate having the above structure was planarized, and a stacked interconnection 1017 of titanium nitride and aluminum was formed and subsequently an interlayer insulating film 1018 was formed. The above interconnection layer can be formed in the same manner as that described at the interconnection step carried out after formation of the capacitor in this embodiment. In the case where hydrogen heat-treatment was performed at 400° C. for 30 minutes after the interconnection step, in the prior art capacitor having the upper electrode made from platinum to which the impurity was not added, the withstand voltage was significantly deteriorated. On the contrary, according to this embodiment, the withstand voltage of the capacitor was not deteriorated not only at the above CVD step, but also at the hydrogen heat-treatment step after the interconnection step, and thus the capacitor in this embodiment was able to keep the characteristics directly after formation of the upper electrode. The final capacitance of the capacitor was 90 fF/$\mu$m$^2$, and the critical voltage for insulation defined by 10$^{-8}$ A/cm$^2$ was 1.2 V.

(Sixth Embodiment)

Figure 19:
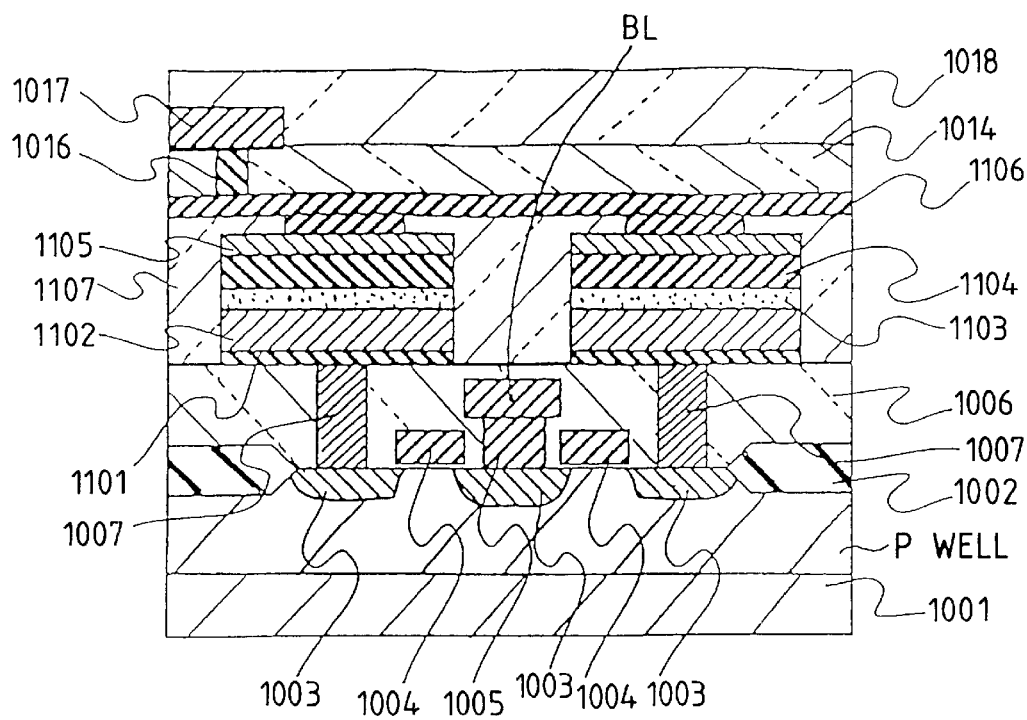
FIG. 19 is a sectional view showing a sixth embodiment of the present invention.
Figure 20:
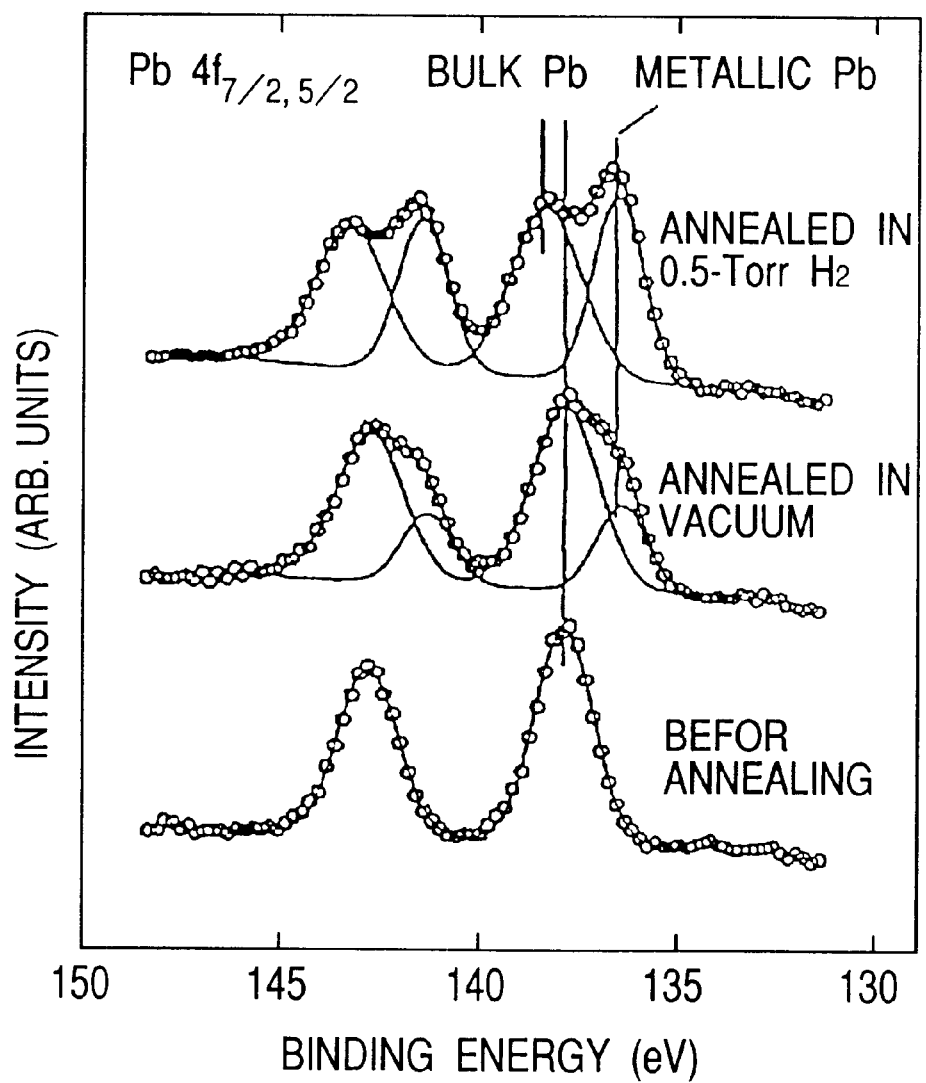
FIG. 20 is a characteristic diagram showing a change in Pb4fXP spectrum of a Pt/PZT interface according to annealing.

FIG. 19 shows an example of a DRAM having a non-volatile operational mode in which PZT is used as a high-dielectric-constant or ferroelectric material.

In this embodiment, the steps up to the step of forming an interlayer insulating film 1006 were carried out in accordance with the same procedure as that for formation of the BST-DRAM in the sixth embodiment.

Next, a titanium nitride film having a thickness of 50 nm was formed, as a layer 1101 for preventing reaction between a lower electrode 1102 and a conductive plug 1007, by a reactive sputtering process. A platinum film having a thickness of 150 nm was formed as the lower electrode 1102 by the DC sputtering process, and then a PZT film 1103 was formed. The PZT film can be formed by any one of the sputtering process, sol-gel process, reactive vapor-deposition process, and CVD process. In particular, by adopting a VD process of thermally decomposing an alcholate or a complex of barium, strontium and titanium in oxygen, a desirable result can be obtained. Further, by adopting a CVD process using lead-dipyvaroyle methanate (Pb(DPM)$_2$), zirconium dipyvaroyle methanate (Zr(DPM)$_4$), or titanium isopropoxide (Ti(i-OC$_3$H$_7$)$_4$), a more desirable result can be obtained. These raw material were stored in a heat reserving vessel, being heated at a temperature ranging from 100° C. to 150° C. for Pb(DPM)$_2$, at a temperature ranging from 150° C. to 200° C. for Zr(DPM)$_4$, or at a temperature ranging from 30° C. to 60° C. for Ti(i-OC$_3$H$_7$)$_4$ in order to allow the raw material to have a suitable vapor pressure, and were fed to a reaction furnace with the aid of argon bubbling. At the same time, oxygen was supplied to the reaction furnace. The raw material thus fed together with oxygen into the reaction furnace were thermally decomposed on the substrate heated at a temperature ranging from 500° C. to 700° C., to be thus oxidized. The thickness of the PZT film was set at 40 nm.

A lead added platinum film having a thickness of 100 nm was formed as an upper electrode layer 1104 by the DC sputtering, and a tungsten layer 1105 having a thickness of 100 nm was formed. After that, a pattern of a capacitor regions was formed by the known photo-lithography, followed by dry-etching, to divide the capacitor into parts corresponding to respective bits. Then, a capacitor protective film 1107 was formed by thermally decomposing the known tetraethoxy silane (TEOS) in an ozone atmosphere, followed by etching-back, and was opened by the known photo-lithography to form electrical connection holes to be connected to the capacitor. A tungsten layer 1106 was formed thereon by the sputtering process in such a manner as to bury the electrical connection holes.

The capacitor portions in this embodiment were thus accomplished. At the interconnection forming step after formation of the capacitor was the same as that for forming the BST-DRAM, however, the prior art capacitor using the upper electrode made from platinum to which the impurity was not added often caused peeling at the interface between the upper electrode 1104 and the PZT film 1103, and therefore, it was not practically used; on the contrary, the capacitor in this embodiment did not cause such peeling, thereby preventing the deterioration of the residual polarization. The final residual polarization was 10 $\mu$C/cm$^2$ upon operation at a voltage source of 3 V, and non-residual polarization component was 20 $\mu$C/cm$^2$.

Industrial Applicability

The present invention is used for various semiconductor memories each having a storage capacity portion such as dynamic random access memory.

What is claimed is:

1. A semiconductor device having an electrical circuit region and a capacitor formed on a principal plane of a semiconductor substrate, said capacitor comprising:

a lower electrode electrically connected to said electrical circuit region;

a ferroelectric film formed on the surface of said lower electrode; and an upper electrode formed on the surface of said ferroelectric film, wherein said upper electrode is subjected to a hydrogen atmosphere during manufacturing and consists essentially of iridium oxide, to which an impurity element having an effect of suppressing the catalytic activity is added.

2. A semiconductor device according to claim 1, wherein said iridium oxide is IrO$_2$.

3. A semiconductor device according to claim 1, wherein said impurity element is lead.

4. A semiconductor device according to claim 1, wherein said impurity element is any one of bismuth, strontium and barium.

5. A semiconductor device according to claim 1, wherein said impurity element forms an oxide.

6. A semiconductor device according to claim 1, wherein said impurity element is precipitated at boundaries of crystal grains of said conductive oxide.

7. A semiconductor device according to claim 1, wherein said upper electrode is free from a material causing a catalytic activity with hydrogen in the atmosphere.

8. A semiconductor device according to claim 1, wherein said ferroelectric film is made from an oxide ferroelectric material.

9. A semiconductor device according to claim 7, wherein said material is any one of platinum, iridium, and ruthenium.

10. A semiconductor device according to claim 1, wherein an interconnection is laid out to connect to a conductive portion extending horizontally outside of an area occupied by said capacitor and being electrically connected to one of said lower and upper electrodes.

* * * * *